(12) United States Patent
Reeves et al.

(10) Patent No.: US 10,971,641 B2
(45) Date of Patent: Apr. 6, 2021

(54) FLEXIBLE OPTOELECTRONIC DEVICES

(71) Applicant: FLEXENABLE LIMITED, Cambridge (GB)

(72) Inventors: William Reeves, Cambridge (GB); Sharjil Siddique, Cambridge (GB)

(73) Assignee: FLEXENBLE LIMITED, Cambridge (GB)

( * ) Notice: Subject to any disclaimer, the term of this patent is extended or adjusted under 35 U.S.C. 154(b) by 0 days.

(21) Appl. No.: 16/460,314

(22) Filed: Jul. 2, 2019

(65) Prior Publication Data
US 2020/0013911 A1 Jan. 9, 2020

(30) Foreign Application Priority Data

Jul. 4, 2018 (GB) .................................. 1810980.1

(51) Int. Cl.
*H01L 27/146* (2006.01)
*H01L 31/0392* (2006.01)
(Continued)

(52) U.S. Cl.
CPC .... *H01L 31/03926* (2013.01); *G02F 1/13306* (2013.01); *G02F 1/133305* (2013.01);
(Continued)

(58) Field of Classification Search
CPC ........... H01L 27/14603; H01L 27/1462; H01L 27/14632; H01L 27/14634; H01L 27/14636; H01L 27/14685; H01L 27/14687; H01L 27/1469; H01L 27/307; H01L 27/3241; H01L 31/02016;
(Continued)

(56) References Cited

U.S. PATENT DOCUMENTS 6,833,900 B2 * 12/2004 Aruga ................... G02F 1/1345
349/149
9,196,876 B2 * 11/2015 Lee ....................... G06F 3/0412
(Continued)

FOREIGN PATENT DOCUMENTS

EP 1 186 938 A2 3/2002

OTHER PUBLICATIONS

British Search Report for GB 1810980.1 dated Dec. 14, 2018.

*Primary Examiner* — Stephen W Smoot
(74) *Attorney, Agent, or Firm* — Sughrue Mion, PLLC

(57) ABSTRACT

An optoelectronic device comprising a unit, which unit comprises: a plurality of resiliently flexible sheet components bonded together, the resiliently flexible sheet components comprising: (i) a first sheet component comprising at least a stack of layers defining an array of pixel electrodes and electrical circuitry for independently addressing each pixel electrodes via addressing conductors outside the array of pixel electrodes; and (ii) a second sheet component bonded to a top surface of the first sheet component; wherein the device further comprises one or more driver chips bonded to the first sheet component in a location underlying the second component and for electrical contact between said addressing conductors and terminals of said one or more driver chips; and wherein the thickness of material in the unit in the region of the one or more driver chips is substantially the same as the thickness of material in the unit in the region of the array.

10 Claims, 3 Drawing Sheets

(51) Int. Cl.
*H01L 31/02* (2006.01)
*G02F 1/1333* (2006.01)
*G02F 1/133* (2006.01)

(52) U.S. Cl.
CPC .... *H01L 27/1469* (2013.01); *H01L 27/14603* (2013.01); *H01L 27/14605* (2013.01); *H01L 27/14614* (2013.01); *H01L 27/14616* (2013.01); *H01L 27/14634* (2013.01); *H01L 27/14636* (2013.01); *H01L 31/02016* (2013.01); *G02F 2202/28* (2013.01)

(58) Field of Classification Search
CPC ........... H01L 31/0216; H01L 31/03926; H01L 31/1876; G02F 1/13306; G02F 1/133305; G02F 1/133308; G02F 2001/133388; G02F 1/1345; G02F 1/13454; G02F 1/13458; G02F 2202/28
See application file for complete search history.

(56) References Cited

U.S. PATENT DOCUMENTS

| | | | |
|---|---|---|---|
| 2008/0013030 A1* | 1/2008 | Fujita | G02F 1/133305 349/151 |
| 2014/0177182 A1* | 6/2014 | Cho | H05K 3/30 361/749 |
| 2017/0131582 A1* | 5/2017 | Park | H01L 51/56 |
| 2017/0148702 A1* | 5/2017 | Funayama | G02F 1/133385 |
| 2017/0323779 A1* | 11/2017 | Um | H01L 27/1262 |
| 2018/0101044 A1* | 4/2018 | Oka | G02F 1/133305 |
| 2018/0231823 A1* | 8/2018 | Hyodo | G02F 1/133305 |
| 2019/0067387 A1* | 2/2019 | Chen | G09G 3/3225 |
| 2019/0129229 A1* | 5/2019 | Cui | G02F 1/133512 |
| 2019/0384091 A1* | 12/2019 | Li | H05K 1/18 |

* cited by examiner

FLEXIBLE OPTOELECTRONIC DEVICES

Some optoelectronic devices comprise a stack of layers formed in situ on a support element and defining an array of pixel electrodes and electrical circuitry via which each pixel electrode is independently addressable via addressing conductors outside the array of pixel electrodes; and some devices have the terminals of one or more driver chips bonded directly to the addressing conductors on the support element, instead of employing a chip-on-flex (COF) technique in which the driver chip terminals are bonded to routing conductors on a separate flexible substrate of smaller stiffness than the support element of the optoelectronic device, and the routing conductors are bonded to the addressing conductors on the support element of the optoelectronic device.

The inventors for the present application have conducted research around further improving retention of the driver chip(s) in contact with the addressing conductors.

There is hereby provided an optoelectronic device comprising a unit, which unit comprises: a plurality of resiliently flexible sheet components bonded together, the resiliently flexible sheet components comprising: (i) a first sheet component comprising at least a stack of layers defining an array of pixel electrodes and electrical circuitry for independently addressing each pixel electrodes via addressing conductors outside the array of pixel electrodes; and (ii) a second sheet component bonded to a top surface of the first sheet component; wherein the device further comprises one or more driver chips bonded to the first sheet component in a location underlying the second component and for electrical contact between said addressing conductors and terminals of said one or more driver chips; and wherein the thickness of material in the unit in the region of the one or more driver chips is substantially the same as the thickness of material in the unit in the region of the array.

According to one embodiment, the one or more driver chips are also bonded to the second sheet component other than via the first sheet component.

According to one embodiment, the unit has a neutral axis passing through or the one or more driver chips, or closely above or closely below the one or more driver chips.

According to one embodiment, the driver chip is bonded to the second sheet component via material filling a space around the one or more driver chips between the first and second sheet components.

According to one embodiment, the first sheet component comprises a resiliently flexible support film supporting at least said stack of layers.

According to one embodiment, the first sheet component comprises a second resiliently flexible support film bonded to the stack, and liquid crystal material contained between the second resiliently flexible support film and the stack.

According to one embodiment, the second sheet component comprises a polarising filter component.

According to one embodiment, the plurality of resiliently flexible sheet components further comprises a third sheet component on the opposite side of the first component to the second component.

According to one embodiment, the third sheet component comprises a polarising filter component.

There is also hereby provided a method of producing a device as described above, the method comprising: applying the one or more driver chips to the first sheet component; bonding the second sheet component to the first component so as to overlie the one or more driver chips; and filling a space between the first and second sheet components and around the one or more driver chips with a material.

An embodiment of the invention is described in detail hereunder, by way of example only, with reference to the accompanying drawings, in which.

An embodiment of the invention is described for the example of a liquid crystal display (LCD) device, but the technique is also applicable to other types of display devices such as light-emitting diode (LED) devices and to other types of optoelectronic devices such as sensor devices.

The term "source conductor" is used to refer to a conductor in electrical series between a chip terminal and the semiconductor channel, and the term "drain conductor" is used to refer to a conductor in electrical series with the chip terminal via the semiconductor channel.

In situ formation of a patterned layer includes a combination of in situ formation of a continuous layer and in situ patterning of that continuous layer.

Figure 8:
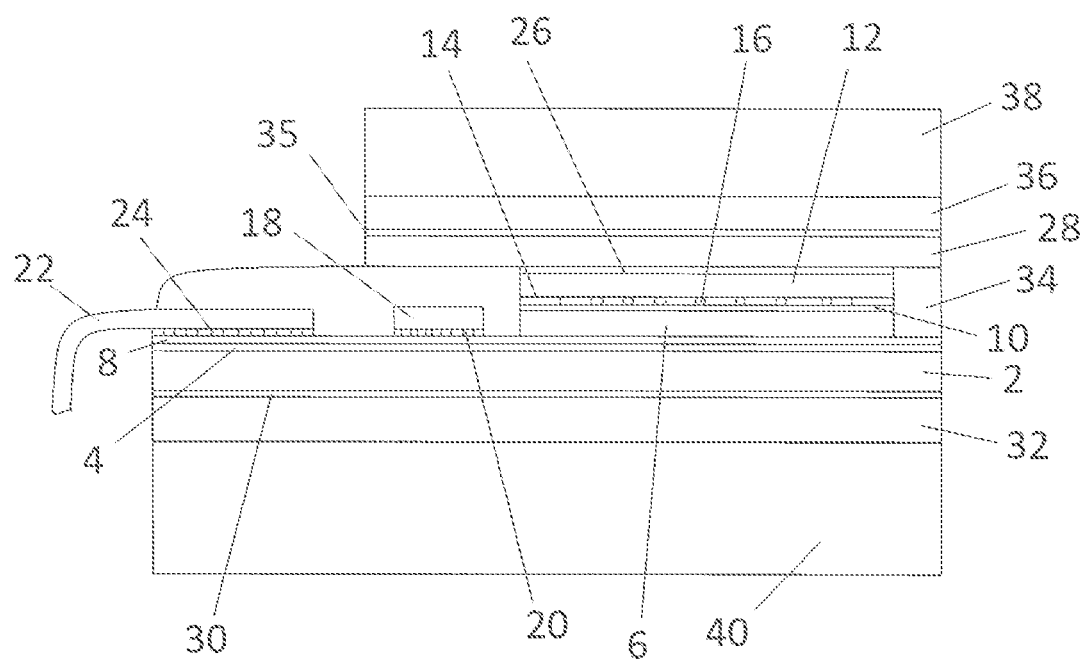
FIG. 8 shows the product device after trimming the assembly of FIG. 7.

In addition, the example device of FIG. 8 comprises a component providing touch sensor functionality and a diffuser component, but the technique is also applicable to LCD devices without these components and/or including additional components.

As described in more detail below, the device unit of FIG. 8 comprises a set of resiliently flexible sheet components bonded together to create a monolithic structure. Flexing of the monolithic structure involves all sheet components of the structure flexing together without substantially any lateral slipping between any two sheet components that is not automatically reversed when the structure is subsequently relaxed. The one or more driver chips 18 are located between two sheet components of the device unit, and the space around the one or more driver chips 18 between those two sheet components is filled with a material such that the thickness of material in the device unit in the region of the one or more driver chips is substantially the same as the thickness of material in the active region (e.g. region of the array of pixel electrodes in the case of a display device) of the device unit (i.e. there are no thickness step changes between the active region of the device unit and the driver chip(s) region of the device unit). This provides a better uniformity of bending stiffness characteristics for the device unit across the driver chip region(s) and the active region. Furthermore, the device unit is designed such that a neutral axis (for flexing of the unit away from a planar configuration) of the device unit passes through the one or more driver chips 18 or closely above or closely below the one or more driver chips 18, to substantially minimise the forces exerted on the one or more driver chips (and thereby substantially minimise the reaction forces exerted by the one or more driver chips on e.g. the conductive bonds between the terminals of the one or more driver chips 18 and the addressing conductors) for a given degree of flexing of the device unit.

Figure 1:
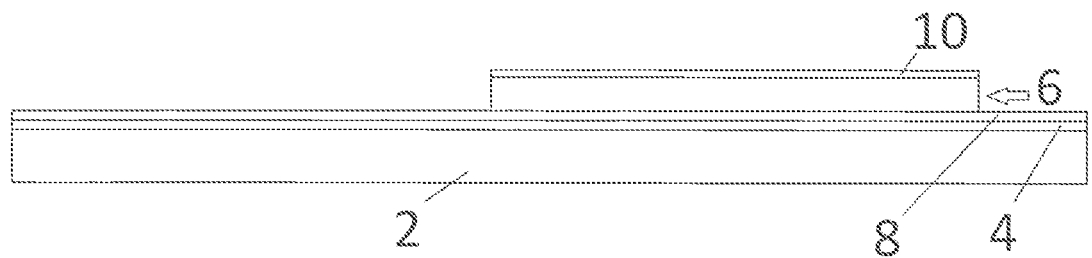
FIG. 1 shows a first flexible sheet component for the production of a liquid crystal display device.

With reference to FIG. 1, a first resiliently flexible sheet component comprises a support element 2 comprising at least a resiliently flexible support film (e.g. organic polymer film such as a cellulose triacetate (TAC) film) coated with a planarisation layer (such as e.g. a layer of SU-8). The support element may include other layers between the support film and the planarisation layer 4, such as one or more layers that provide an optical and/or electrical function, such as a patterned conductor layer that functions to shield the semiconductor channels (mentioned below) from light from the direction of the support film.

Conductor, semiconductor and insulator/dielectric layers are formed in situ over the planarisation layer 4 to produce a stack 6 defining at least: an array of pixel electrodes 10, and electrical circuitry via which each pixel electrode is independently addressable via conductors outside the array of pixel electrodes 10. The pixel electrodes 10 are shown at the top of the stack 6 in the drawings, but the array of pixel electrodes may be below the top of the stack 6 for some types of display devices, such as fringe field switching (FFS) LCD devices, in which a patterned common conductor (COM) overlies the pixel electrodes via a dielectric.

The stack 6 includes a patterned conductor layer 8 (which may or may not comprise a stack of sub-layers) formed in situ on the planarisation layer 4 at a first conductor level of the stack, defining at least: (i) an array of source conductors each associated with a respective column of transistors and extending beyond an edge of the array of pixel electrodes for connection to a respective terminal of a driver chip (discussed in more detail below), and (ii) an array of drain conductors, each drain conductor associated with a respective transistor. Each source conductor includes an addressing line that extends beyond an edge of the array for connection to a respective terminal of a driver chip, and one or more source conductor fingers for each transistor, which source conductor fingers branch off from the addressing line. The source conductor fingers are the portions of the source conductor in closest proximity to the drain conductors. The drain conductor includes one or more drain conductor fingers which extend in parallel to the source conductor fingers (e.g. interdigitated with the source conductor fingers), and which are the parts of the drain conductor in closest proximity to the source conductor. Each drain conductor also includes a drain pad.

As schematically illustrated in the drawings, the patterned conductor layer 8 at the first conductor level extends beyond the lateral edges of the remainder of the stack 6, where the source conductors terminate in respective contact pads for contacting respective terminals of one or more driver chips 18. This patterned conductor layer 8 at the first conductor level also defines an array of gate addressing conductors, each connected to a respective gate conductor of a conductor pattern at another conductor level of the stack 6 (discussed below) via conductive connections between conductive levels within the stack 6, and each terminating in a respective contact pad for contacting a respective terminal of one or more driver chips 18.

The stack 6 includes a patterned layer of (e.g. organic polymer) semiconductor channel material (which may or may not comprise a stack of sub-layers) formed in situ on the patterned conductor layer 8 at the first conductor level. The formation of the patterned semiconductor layer may be preceded by the formation on the surface of the source-drain conductor pattern of one or more layers that improve charge transfer between the source-drain conductor pattern and the semiconductor channel material, such as e.g. a self-assembled monolayer of a suitable organic material. The patterned layer of semiconductor channel material defines an array of isolated islands 6 of semiconductor channel material, each island 6 providing the semiconductor channel for a respective transistor of the array.

The stack 6 also includes a (e.g. organic polymer) gate dielectric layer (which may or may not comprise a stack of sub-layers) formed in situ over the patterned layer of semiconductor channel material; and a $2^{nd}$ patterned conductor layer (which may or may not comprise a stack of sub-layers) defining at least an array of gate conductors 10. Each gate conductor is associated with a respective row of transistors and is connected to a respective gate addressing conductor at the first conductor level via a respective interlayer connection through the gate dielectric. Each transistor is associated with a unique combination of gate and source conductors, whereby each pixel can be addressed independently of all other pixels.

The stack 6 further includes an insulator/dielectric layer (which may or may not comprise a stack of sub-layers) formed in situ over the $2^{nd}$ patterned conductor layer. At this stage, the stack is patterned to define via holes each extending down to a respective drain conductor (drain pad mentioned above) at the first conductor level. Another patterned conductor layer (which may or may not comprise a stack of sub-layers) is then formed in situ over the insulator/dielectric layer. This patterned conductor layer provides the array of pixel electrodes 10 each in contact with a respective drain conductor at the first conductor level.

The stack 6 may include additional layers such as the patterned common (COM) conductor layer for a FFS-LCD device.

Figure 2:
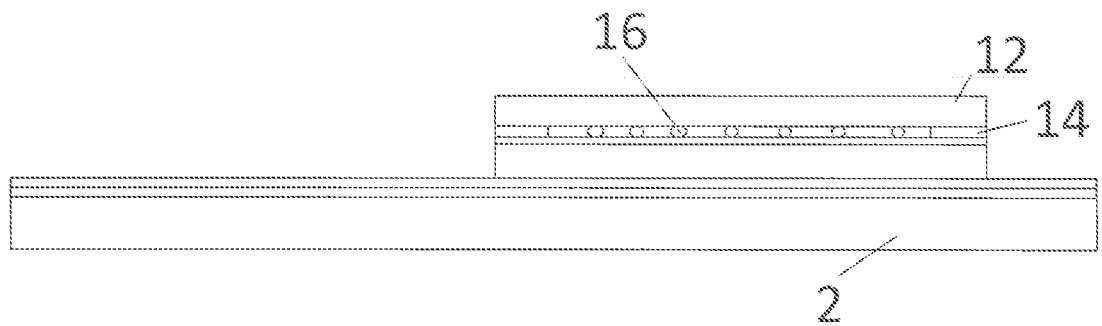
FIG. 2 shows the bonding of a second flexible sheet component to the flexible sheet component of FIG. 1.

With reference to FIG. 2, the first sheet component of FIG. 1 is bonded to a second resiliently flexible sheet component 12, and the two sheet components contain a thickness of liquid crystal material therebetween. The second resiliently flexible sheet component 12 comprises a resiliently flexible support film (e.g. organic polymer film such as a cellulose triacetate (TAC) film) with an alignment layer (e.g. rubbed polyimide layer) formed in situ on the support film. The same kind of alignment layer (not shown) is also formed in situ on the uppermost surface of the stack 6 of the first sheet component before bonding the first and second sheet components together. Bonding of the two components is achieved with adhesive material 14 outside the array of pixel electrodes (active display area), which adhesive material also functions to laterally contain the liquid crystal material. Spacers 16 are provided to better ensure a uniform thickness of liquid crystal material over all pixel electrodes.

Figure 3:
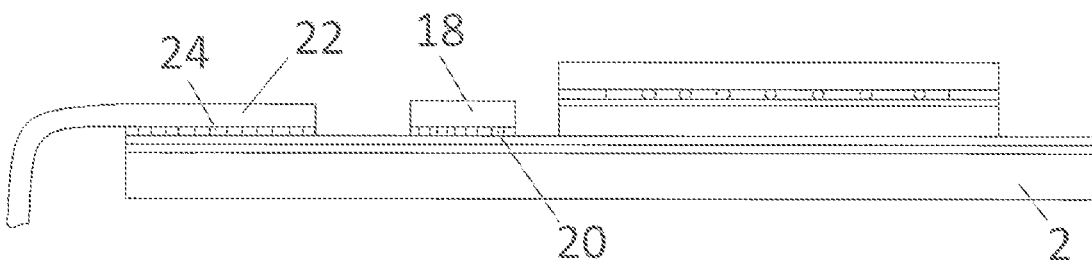
FIG. 3 shows the bonding of one or more driver chips to the first flexible sheet component of the assembly of FIG. 2.

With reference to FIG. 3, one or more (e.g. silicon) driver chips 18 (which have a relatively high bending stiffness compared to each sheet component of the device unit) are bonded to the first component for (i) electrical contact between the output terminals 20 of the one or more driver chips and the addressing conductors (source and gate, in this example) defined by the patterned conductor layer 8 at the first conductor level of the stack 6; and (ii) electrical contact between the input terminals 20 of the one of more driver chips 18 and further, input conductors also defined by the patterned conductor layer 8 at the first conductor level of the stack, which input conductors make contact with respective conductors 24 on a flexible substrate material 22 (flex connector) bonded to an edge portion of the first sheet component. In this example, the one or more driver chips comprise a set of elongate source and gate driver chips all orientated in the same direction (parallel to one edge of the pixel electrode array) and located along one edge of the pixel electrode array. According to one variation, the gate drive circuitry is instead defined by a stack of layers formed in situ over the support element 2 (e.g. the same stack 6 that defines the array of pixel electrodes 10, and electrical circuitry via which each pixel electrode is independently addressable via conductors outside the array of pixel electrodes 10) at a location outside an edge of the pixel electrode array perpendicular to that edge of the pixel electrode array outside which the one or more driver chips 18 are located; and the one or more driver chips 18 comprise one or more source driver chips without any gate driver chips.

Figure 4:
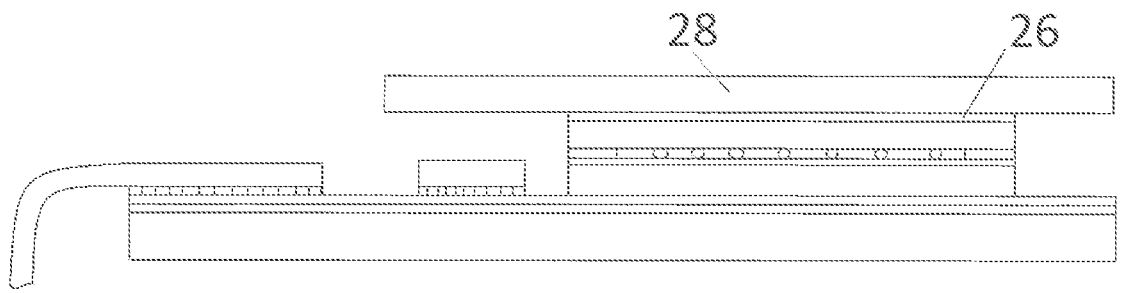
FIG. 4 shows the bonding of a moisture barrier layer and polariser component to the second flexible sheet component of the assembly of FIG. 3.

With reference to FIG. 4, a moisture barrier layer (encapsulation layer) 26 is bonded to the upper surface of the second sheet component of the unit of FIG. 3. The bonding may, for example, be achieved by a dry bond lamination technique using a pre-formed optically clear adhesive (OCA) layer (not shown). A third resiliently flexible sheet component 28 comprising a polariser component is then bonded to the moisture barrier layer 26. This bonding may, for example, also be achieved by a dry bond lamination technique using an optically clear adhesive layer forming an integral part of the polariser component (and temporarily protected by a release layer). The polariser component 28 extends continuously over the whole area of the stack 6 and beyond the lateral edges of the stack and also extends over the one or more driver chips 18.

Examples of variations include: (i) bonding the third sheet component (polariser component) 28 to the upper surface of the second sheet component of the unit of FIG. 3, and then bonding a moisture barrier layer to the upper surface of the third sheet component 28; and (ii) pre-preparing a third sheet component incorporating both polariser and moisture barrier functions, and bonding the multi-function third sheet component to the upper surface of the second sheet component of the unit of FIG. 3.

Figure 5:
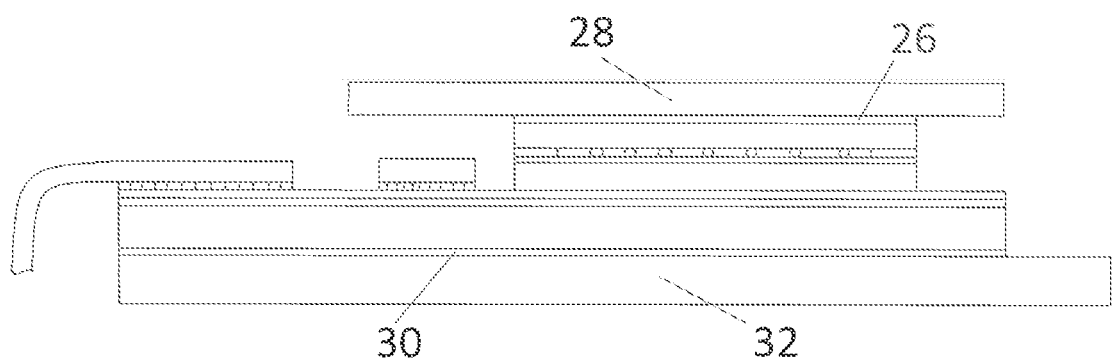
FIG. 5 shows the bonding of a further moisture barrier layer and further polariser component to the first flexible sheet component of the assembly of FIG. 4.

With reference to FIG. 5, a further moisture barrier layer (encapsulation layer) 30 is bonded to the under surface of the first sheet component of the unit of FIG. 4. This bonding may also be achieved by, for example, a dry bond lamination technique using a pre-formed OCA layer (not shown). A fourth resiliently flexible sheet component 32 comprising a polariser component is then bonded to the moisture barrier layer 30, This bonding may also be achieved, for example, by a dry bond lamination technique using a pre-formed optically clear adhesive layer forming an integral part of the polariser component 32 (and temporarily protected by a release layer). The lower polariser component 32 extends continuously over substantially the whole area of the first sheet component.

Again, examples of variations include: (i) bonding the fourth sheet component (polariser component) 32 to the under surface of the first sheet component of the unit of FIG. 4, and then bonding a moisture barrier layer to the under surface of the fourth sheet component 32; and (ii) pre-preparing a fourth sheet component incorporating both polariser and moisture barrier functions, and bonding the multi-function fourth sheet component to the under surface of the first sheet component of the unit of FIG. 4.

Figure 6:
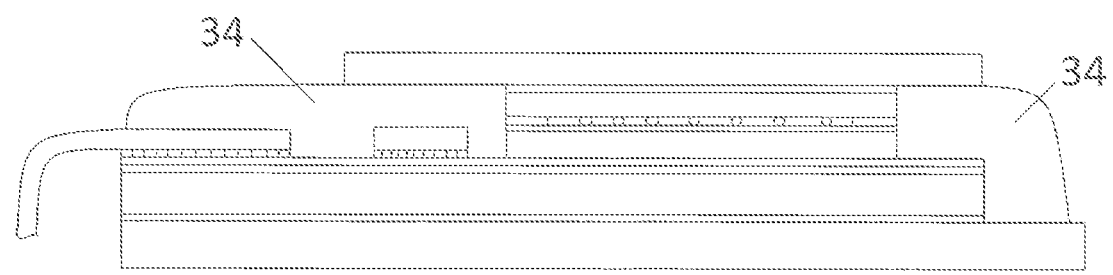
FIG. 6 shows the dispensing of a potting compound onto the assembly of FIG. 5.

With reference to FIG. 6, a potting compound (such as a liquid resin) 34 is dispensed over substantially the whole part of the area of the first sheet component not covered by the upper polariser component 26, and also over at least part of the lower polariser sheet component 32 extending laterally beyond the first sheet component. Under capillary action, the potting compound 34 fills the space between the first sheet component and the upper polariser component 26, including the space around (above and laterally) the one or more driver chips 18. This potting compound 34 provides a direct solid bond between the one or more driver chips 18 and the upper polariser component 26. The extension of the second sheet component over the one or more driver chips 18 and the filling of the space around the one or more driver chips 18 with potting compound provides a resulting unit with substantially the same thickness of material in both the region of the one or more driver chips and the active region, and provides a better uniformity of bending stiffness characteristics for the device unit across the driver chip region(s) and the active region. The potting compound may also provide protection for the stack 6 and/or liquid crystal material against the ingress of moisture.

Figure 7:
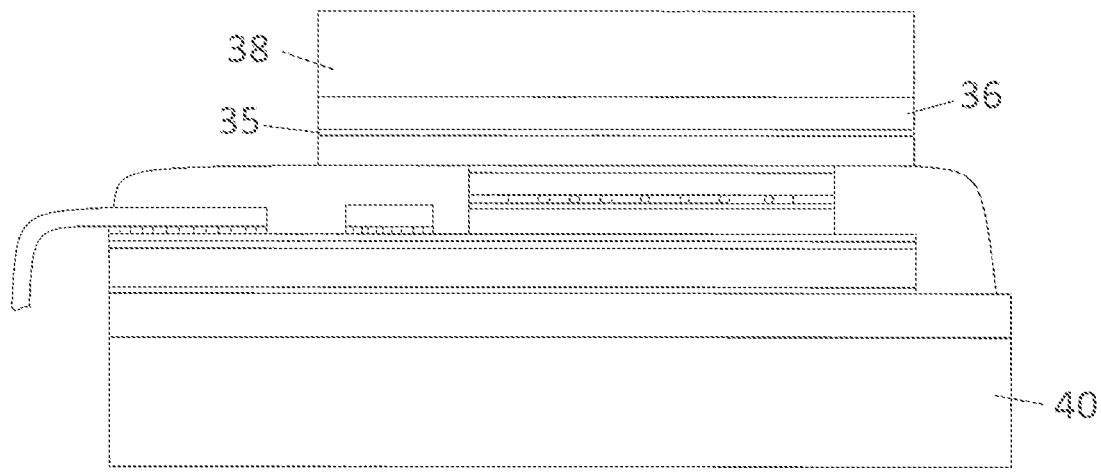
FIG. 7 shows the bonding of a further components to the assembly of FIG. 6.

With reference to FIG. 7, a pre-prepared fifth resiliently flexible sheet component 36 providing touch sensor functionality is bonded to the upper surface of the upper polariser component. This bonding may, for example, also be achieved by a dry bond lamination technique using a pre-formed layer of optically clear adhesive (OCA) 35, which may form part of the pre-prepared touch sensor component 36, with release layer protection. Another flex connector (not shown) extends from the touch sensor component 36 to provide electrical connections to an external processor. A sixth resiliently flexible sheet component 38 (providing a transparent protective window) is bonded to the upper surface of the touch-screen component 36, and a seventh resiliently flexible sheet component (comprising an optical diffuser) is bonded to the under surface of the lower polariser component 32. For each of these bonding operations, the bonding may, for example, be achieved by a dry bond lamination technique using a pre-formed optically clear adhesive (OCA) layer (not shown).

The upper surface (user viewing surface) of the window component 38 may be provided with e.g. a non-transmissive frame (not shown) covering the whole area of the device unit other than the active (pixel electrode array) region, which frame is substantially non-transmissive over the whole of the visible spectrum. This frame may be created by painting a frame pattern onto the upper surface of the window component 38, or bonding a pre-prepared plastic sheet defining a frame pattern to the upper surface of the window component 38.

The resulting monolithic unit shown in FIG. 7 is then trimmed on all (three) sides except the side from which the flex connectors 22 project, to create flush edges on those three sides.

According to one variation, the window component 38 and the diffuser component 40 are omitted to facilitate the creation of a monolithic unit with a smaller bending stiffness. In this variation, a stiffener may be bonded to the under surface of the lower polariser component 32 selectively in the region of the one or more driver chips. The stiffener may, for example, be a piece of fibre-reinforced resin laminate material such as FR4-grade glass-reinforced epoxy laminate material, which is composed of woven fiberglass cloth with an epoxy resin binder. The bonding of the stiffener to the under surface of the lower polariser component may be achieved using a double-sided dry adhesive.

The order in which the sheet components are bonded to each other may be different to that of the example described above. For example, the order may follow the example described above, except that the touch sensor component 36 is bonded to the window component 38, before bonding this bonded combination to the upper surface of the intermediate unit comprising the upper polariser component, stack, liquid crystal material etc.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. An optoelectronic device comprising a unit, which unit comprises: a plurality of resiliently flexible sheet components bonded together, the resiliently flexible sheet components comprising: (i) a first sheet component comprising at least a stack of layers defining an array of pixel electrodes and electrical circuitry for independently addressing each pixel electrode via addressing conductors outside the array of pixel electrodes; and (ii) a second sheet component bonded to a top surface of the first sheet component; wherein the device further comprises one or more driver chips bonded to the first sheet component in a location underlying the second sheet component and for electrical contact between said addressing conductors and terminals of said one or more driver chips; and wherein the thickness of material in the unit in a region of the one or more driver chips is substantially the same as the thickness of material in the unit in a region of the array.

2. The device according to claim 1, wherein the one or more driver chips are also bonded to the second sheet component other than via the first sheet component.

3. The device according to claim 1, wherein the unit has a neutral axis passing through the one or more driver chips, or closely above or closely below the one or more driver chips.

4. The device according to claim 1, wherein the one or more driver chips are bonded to the second sheet component via material filling a space around the one or more driver chips between the first and second sheet components.

5. The device according to claim 1, wherein the first sheet component comprises a resiliently flexible support film supporting at least said stack of layers.

6. The device according to claim 1, wherein the first sheet component comprises a second resiliently flexible support film bonded to the stack, and liquid crystal material contained between the second resiliently flexible support film and the stack.

7. The device according to claim 1, wherein the second sheet component comprises a polarising filter component.

8. The device according to claim 1, wherein the plurality of resiliently flexible sheet components further comprises a third sheet component on the opposite side of the first sheet component to the second sheet component.

9. The device according to claim 8, wherein the third sheet component comprises a polarising filter component.

10. A method of producing a device according claim 1, the method comprising: applying the one or more driver chips to the first sheet component; bonding the second sheet component to the first sheet component so as to overlie the one or more driver chips; and filling a space between the first and second sheet components and around the one or more driver chips with a material.

* * * * *